(12) United States Patent  
Chi

(10) Patent No.: US 12,457,005 B2  
(45) Date of Patent: Oct. 28, 2025

(54) MANUFACTURING METHOD OF ELECTRONIC DEVICE

(71) Applicant: Innolux Corporation, Miao-Li County (TW)

(72) Inventor: Jen-Hai Chi, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 606 days.

(21) Appl. No.: 17/533,090

(22) Filed: Nov. 22, 2021

(65) Prior Publication Data

US 2022/0200652 A1    Jun. 23, 2022

Related U.S. Application Data

(60) Provisional application No. 63/127,164, filed on Dec. 18, 2020.

(30) Foreign Application Priority Data

Oct. 13, 2021   (CN) .......................... 202111192481.7

(51) Int. Cl.  
    *H04B 1/66*     (2006.01)  
    *H01B 1/12*     (2006.01)  
    *H01B 13/32*    (2006.01)  
    *H04B 1/03*     (2006.01)  
(52) U.S. Cl.  
    CPC ............... *H04B 1/66* (2013.01); *H01B 1/124* (2013.01); *H01B 13/32* (2013.01); *H04B 1/03* (2013.01); *Y10T 29/49165* (2015.01)

(58) Field of Classification Search  
    CPC ........ H04B 1/66; H05K 3/4644; H05K 1/115; H05K 3/429; Y10T 29/49165  
    USPC .................................. 29/852, 825, 829, 846  
    See application file for complete search history.

(56) References Cited

U.S. PATENT DOCUMENTS

| | | | |
|---|---|---|---|
| 8,134,085 B2 * | 3/2012 | Samejima | H05K 3/4641 174/262 |
| 8,178,791 B2 * | 5/2012 | Abe | H05K 3/445 174/262 |
| 2006/0164586 A1 | 7/2006 | Yamada | |
| 2011/0210426 A1 | 9/2011 | Matsui | |
| 2012/0024586 A1 | 2/2012 | Yoshimura et al. | |
| 2017/0018492 A1 | 1/2017 | Mayoshi et al. | |
| 2017/0335466 A1 | 11/2017 | Domey et al. | |

OTHER PUBLICATIONS

"Search Report of Europe Counterpart Application", issued on May 20, 2022, p. 1-p. 7.  
"Office Action of Taiwan Counterpart Application", issued on Oct. 11, 2022, p. 1-p. 7.

* cited by examiner

*Primary Examiner* — Thiem D Phan  
(74) *Attorney, Agent, or Firm* — JCIPRNET

(57) ABSTRACT

The disclosure provides a manufacturing method of an electronic device. The manufacturing method of the electronic device includes steps as follows. A substrate is provided. A first opening is formed and penetrates the substrate. A polymer layer is formed in the first opening. The polymer layer is in contact with a sidewall of the substrate at the first opening.

17 Claims, 11 Drawing Sheets

MANUFACTURING METHOD OF ELECTRONIC DEVICE

CROSS-REFERENCE TO RELATED APPLICATION

This application claims the priority benefit of U.S. provisional application Ser. No. 63/127,164, filed on Dec. 18, 2020 and China application serial no. 202111192481.7, filed on Oct. 13, 2021. The entirety of each of the above-mentioned patent application is hereby incorporated by reference herein and made a part of this specification.

BACKGROUND

Technical Field

The disclosure relates to a manufacturing method of an electronic device, and particularly, to a manufacturing method of an electronic device capable of shortening the distance of signal transmission.

Description of Related Art

Electronic devices or splicing electronic devices have been widely applied in mobile phones, television sets, monitors, tablet computers, car displays, wearable devices, and desktop computers. With the vigorous development of the electronic devices, the quality requirements for the electronic devices becomes highly demanding.

SUMMARY

The disclosure provides a manufacturing method of an electronic device capable of shortening the distance of signal transmission.

According to the embodiment of the disclosure, the manufacturing method of the electronic device includes steps as follows. First, a substrate is provided. Next, a first opening is formed and penetrates the substrate. Next, a polymer layer is formed in the first opening. The polymer layer is in contact with a sidewall of the substrate at the first opening.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
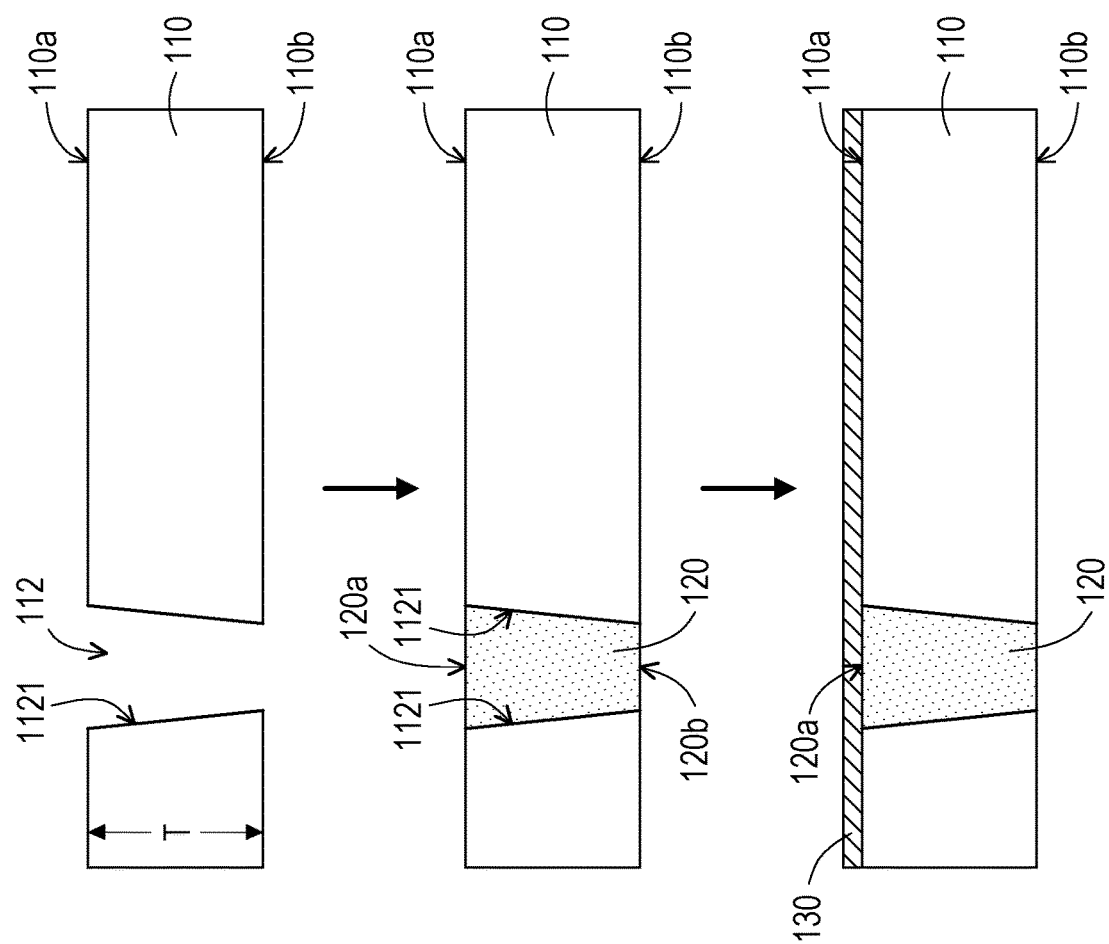
FIG. 1A to FIG. 1K are schematic cross-sectional views illustrating a manufacturing method of an electronic device according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

In the following specification and claims, the terms "including", "containing", "having", etc., are open-ended terms, so they should be interpreted to mean "including but not limited to . . . ".

It should be understood that when an element or layer is referred to as being "on" or "connected to" another element or layer, it can be directly set on the another element or layer or directly connected to the another element or layer, or there is an intervening element or layer between the two (indirect connection). In contrast, when an element is referred to as being "directly on" or "directly connected to" another element or layer, there are no intervening elements or layers between the two.

Although the terms first, second, third . . . can be used to describe a variety of elements, the elements are not limited by this term. This term is only used to distinguish a single element from other elements in the specification. Different terminologies may be adopted in claims, and replaced with the first, second, third . . . in accordance with the order of elements specified in the claims. Therefore, in the following description, the first element may be described as the second element in the claims.

In the description, the terms such as "about", "equal", "same", "substantially", or "approximately" are generally interpreted as being within a range of plus or minus 10% of a given value or range, or as being within a range of plus or minus 5%, plus or minus 3%, plus or minus 2%, plus or minus 1%, or plus or minus 0.5% of the given value or range. The quantity given here is an approximate quantity, that is, in the absence of a specific description of "about", "equal", "substantially" or "approximately", the quantity given here still implies the meaning of "about", "equal", "substantially" and "approximately".

In some embodiments of the disclosure, terms such as "connect" and "interconnect" with respect to bonding and connection, unless specifically defined, may refer to two structures that are in direct contact with each other, or may refer to two structures that are indirectly in contact with each other, wherein there are other structures set between these two structures. Moreover, the terms that describe joining and connecting may apply to the case where both structures are movable or both structures are fixed. Moreover, the term "coupling" involves any direct and indirect electrical coupling means.

The electronic device may include a display device, an antenna device (e.g., an LCD antenna), a sensing device, a light-emitting device, a touch display device, or a splicing device, but the disclosure is not limited thereto. The electronic device may be a bendable or flexible electronic device. The electronic device may be in a rectangular shape, a circular shape, a polygonal shape, a shape with curved edges, or other suitable shapes. The electronic device may include light-emitting diodes (LEDs), liquid crystals, fluorescence, phosphor, or quantum dots (QDs), other suitable materials, or a combination thereof, but the disclosure is not limited thereto. The light-emitting diodes may include organic light-emitting diodes (OLEDs), inorganic light-emitting diodes, mini LEDs, micro LEDs or quantum dot light-emitting diodes (QDLEDs), other suitable types of materials, or a combination thereof, but the disclosure is not limited thereto. The display device may also include, for example, a spliced display device, but the disclosure is not limited thereto. The antenna device may be, for example, a liquid crystal antenna, but the disclosure is not limited thereto. The antenna device may include, for example, an antenna splicing device, but the disclosure is not limited thereto. Note that the electronic device can be any combination thereof, but the disclosure is not limited thereto. Moreover, the electronic device may be in a rectangular shape, a circular shape, a polygonal shape, a shape with curved edges, or other suitable shapes. The electronic device may have peripheral systems such as a driving system, a control system, a light source system, a shelf system, etc. to support the display device, the antenna device, or the spliced device. Hereinafter, an electronic device will be used to illustrate the content of the disclosure, but the disclosure is not limited thereto.

In the disclosure, the features of multiple embodiments to be described below may be replaced, recombined, or mixed to form other embodiments without departing from the spirit of the disclosure. The features of multiple embodiments may be used in combination as long as such combination does not depart from the spirit of the disclosure or lead to conflict.

Reference will now be made in detail to the exemplary embodiments of the disclosure, examples of which are illustrated in the accompanying drawings. Whenever possible, the same reference numerals are used to represent the same or similar parts in the accompanying drawings and description.

FIG. 1A to FIG. 1K are schematic cross-sectional views illustrating a manufacturing method of an electronic device according to an embodiment of the disclosure. The manufacturing method of an electronic device 100 of the embodiment may include steps as follows.

First, referring to FIG. 1A, a substrate 110 is provided. The substrate 110 has a surface 110a and another surface 110b, and the surface 110a and the another surface 110b are opposite to each other. The substrate 110 has a thickness T, and the thickness T is the maximum thickness of the substrate 110 measured along its normal direction, for example. In the embodiment, the thickness T is 0.05 mm to 2 mm (i.e., 0.05 mm≤T≤2 mm), for example, but the disclosure is not limited thereto. Moreover, in the embodiment, the substrate 110 may include a rigid substrate, a flexible substrate, or a combination thereof. For example, the material of the substrate 110 may include glass, quartz, silicon wafer, sapphire, III-V semiconductor materials, ceramics, polycarbonate (PC), polyimide (PI), polyethylene terephthalate (PET), other suitable substrate materials, or a combination thereof, but the disclosure is not limited thereto. In some embodiments, the substrate 110 may be a printed circuit board.

Next, referring to FIG. 1A, a first opening 112 is formed in the substrate 110, and a polymer layer 120 is formed in the first opening 112. Specifically, in the embodiment, for example, the first opening 112 is formed by laser drilling or etching, and the polymer layer 120 is formed by a vacuum screen printing, for example. However, the disclosure does not limit the method for forming the first opening 112 and the polymer layer 120. The first opening 112 may penetrate the substrate 110. The polymer layer 120 may be filled in the first opening 112, and the polymer layer 120 may be in contact with a sidewall 1121 of the substrate 110 at the first opening 112. The polymer layer 120 may have a first surface 120a and a second surface 120b opposite to each other. The first surface 120a may be aligned with the surface 110a of the substrate 110, and the second surface 120b may be aligned with the another surface 110b of the substrate 110. In some embodiments, the first surface 120a is higher than the surface 110a of the substrate 110, and the second surface 120b is higher than the another surface 110b of the substrate 110. In some embodiments, the first surface 120a is lower than the surface 110a of the substrate 110, and the second surface 120b is lower than the another surface 110b of the substrate 110. Moreover, in the embodiment, the material of the polymer layer 120 may include epoxy resin, polyimide, other suitable resin materials, or a combination thereof, but the disclosure is not limited thereto. In the embodiment, the polymer layer 120 is filled in the first opening 112, which may be used to protect the first opening 112 from being directly filled with metal. Since the difference between coefficients of thermal expansion of the metal and the substrate 110 is too large, if the metal is directly filled into the first opening 112, the first opening 112 may be broken. Moreover, filling the polymer layer 120 in the first opening 112 may also prevent the etching solution from flowing into the first opening 112 in the subsequent process or flowing further to the bottom of the substrate 110, which causes damage to the bottom film.

Next, referring to FIG. 1A again, a first conductive layer 130 is formed on the surface 110a of the substrate 110 so that the first conductive layer 130 may cover and may be in contact with the surface 110a of the substrate 110 and the first surface 120a of the polymer layer 120. The first conductive layer 130 is formed by sputtering, coating, or chemical vapor deposition, for example, but the disclosure is not limited thereto.

Figure 1B:
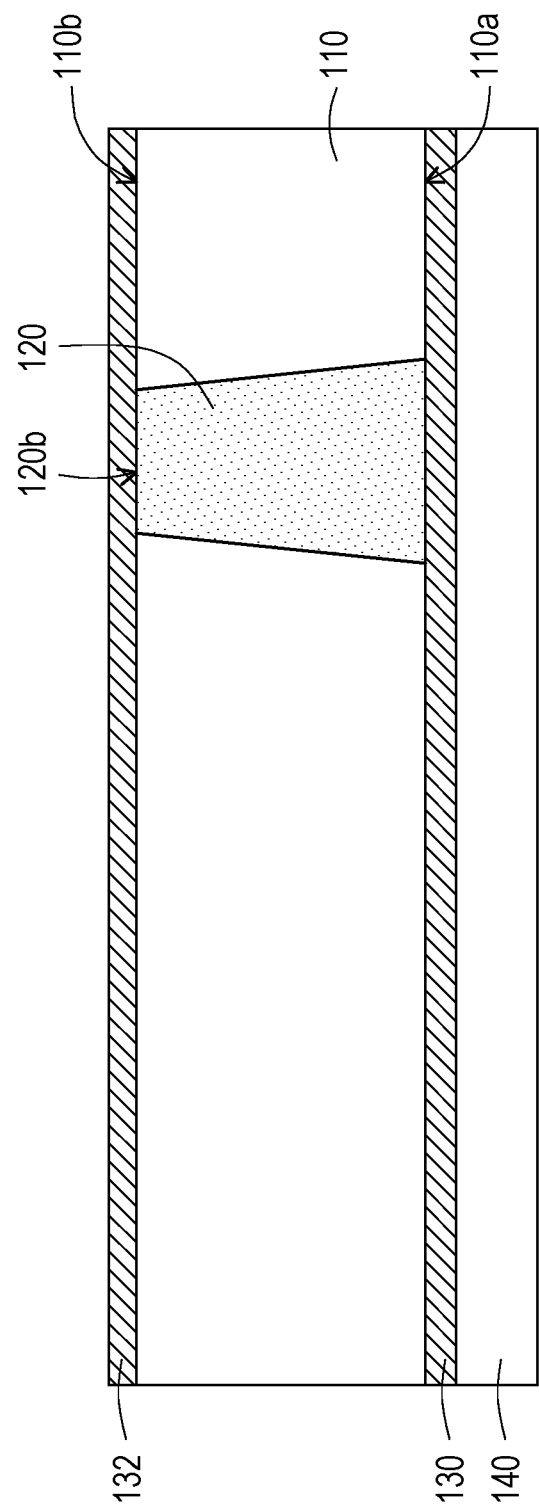

Next, referring to FIG. 1B, a protection layer 140 is formed on the surface 110a of the substrate 110, and after the substrate 110 is turned upside down, a second conductive layer 132 is formed on the another surface 110b of the substrate 110. With the configuration of the protection layer 140, after being turned upside down, the first conductive layer 130 may not be subject to damage in the subsequent process. Specifically, in the embodiment, the second conductive layer 132 is formed by sputtering, coating, or chemical vapor deposition, for example, but the disclosure is not limited thereto. The protection layer 140 may cover the first conductive layer 130 to protect the first conductive layer 130. The second conductive layer 132 may cover and may be in contact with the second surface 120b of the polymer layer 120. Moreover, in the embodiment, the protection layer 140 may be a temporary protective film (TPF), for example, but the disclosure is not limited thereto.

Figure 1C:
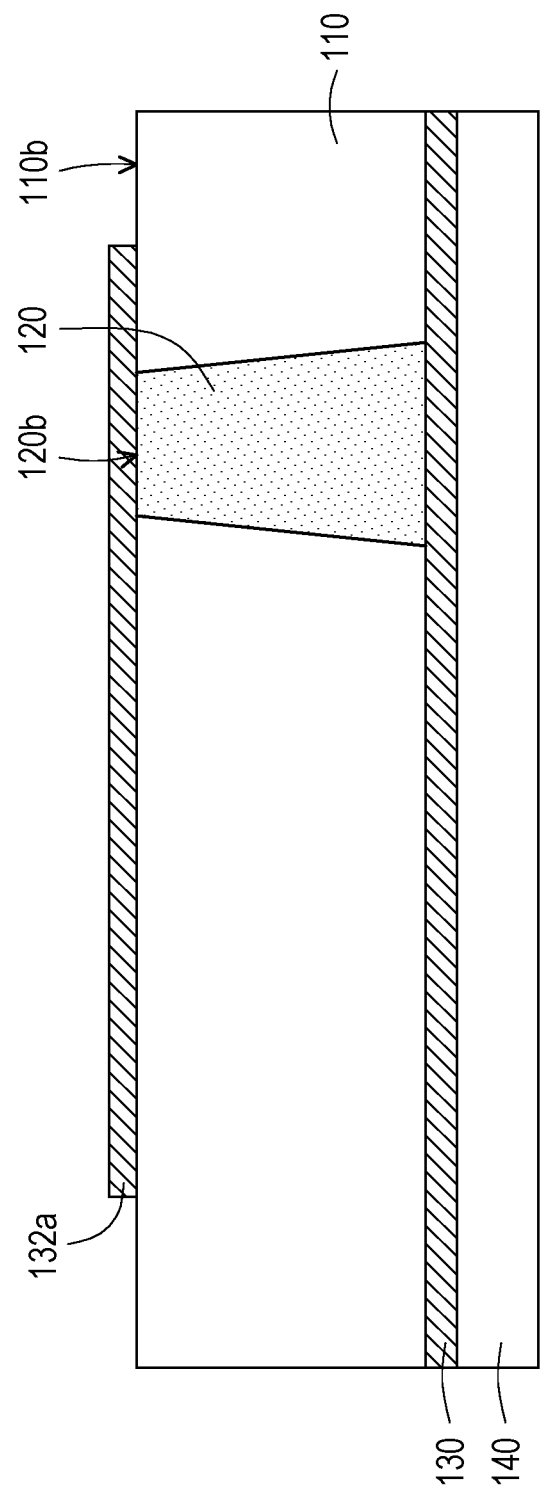

Next, referring to FIG. 1C, a patterned second conductive layer pattern 132a is formed. In the embodiment, for example, the second conductive layer 132 is etched by a photolithography method to form the second conductive layer pattern 132a, but the disclosure is not limited thereto. The second conductive layer pattern 132a may cover and may be in contact with part of the another surface 110b of the substrate 110 and the second surface 120b of the polymer layer 120. The second conductive layer pattern 132a may expose part of the another surface 110b.

Figure 1D:
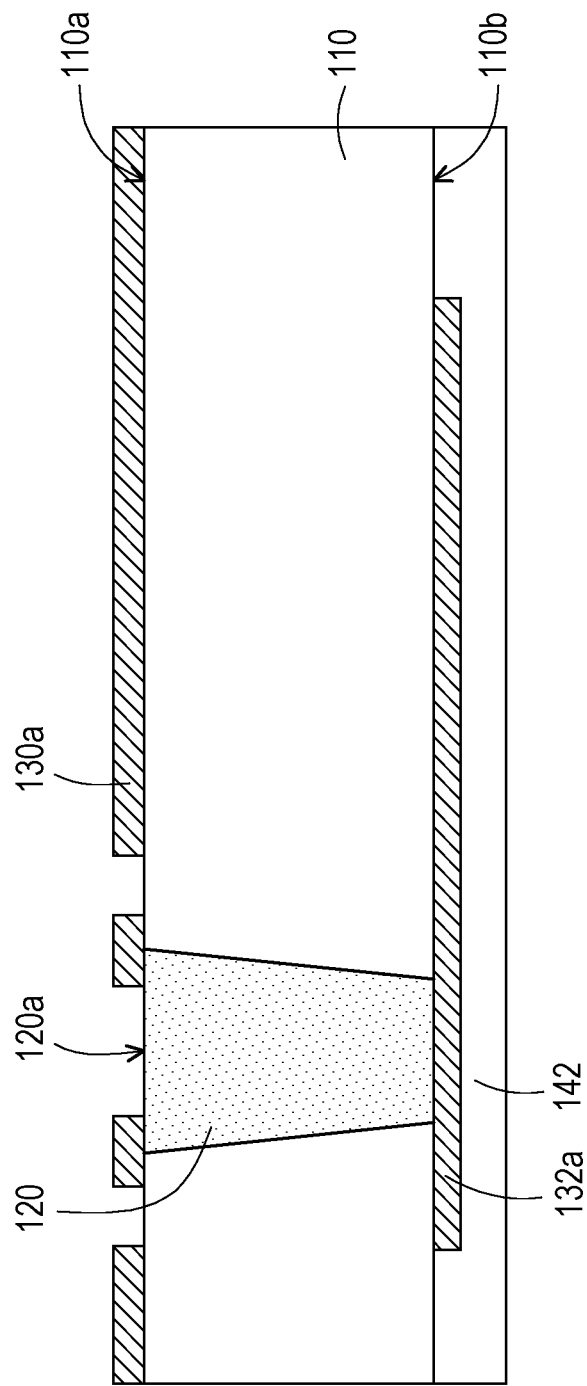

Next, referring to FIG. 1D, a protection layer 142 is formed on the another surface 110b of the substrate 110. After the substrate 110 is turned upside down again, the protection layer 140 is removed, and a patterned first conductive layer pattern 130a is formed. In the embodiment, for example, the first conductive layer 130 is etched by a photolithography method to form the first conductive layer pattern 130a, but the disclosure is not limited thereto. The protection layer 142 may cover the second conductive layer pattern 132a to protect the second conductive layer pattern 132a from being damaged in the subsequent process after the substrate 110 is turned upside down. The first conductive layer pattern 130a may expose part of the surface 110a. The first conductive layer pattern 130a may cover and may be in contact with part of the first surface 120a of the polymer layer 120.

Figure 1E:
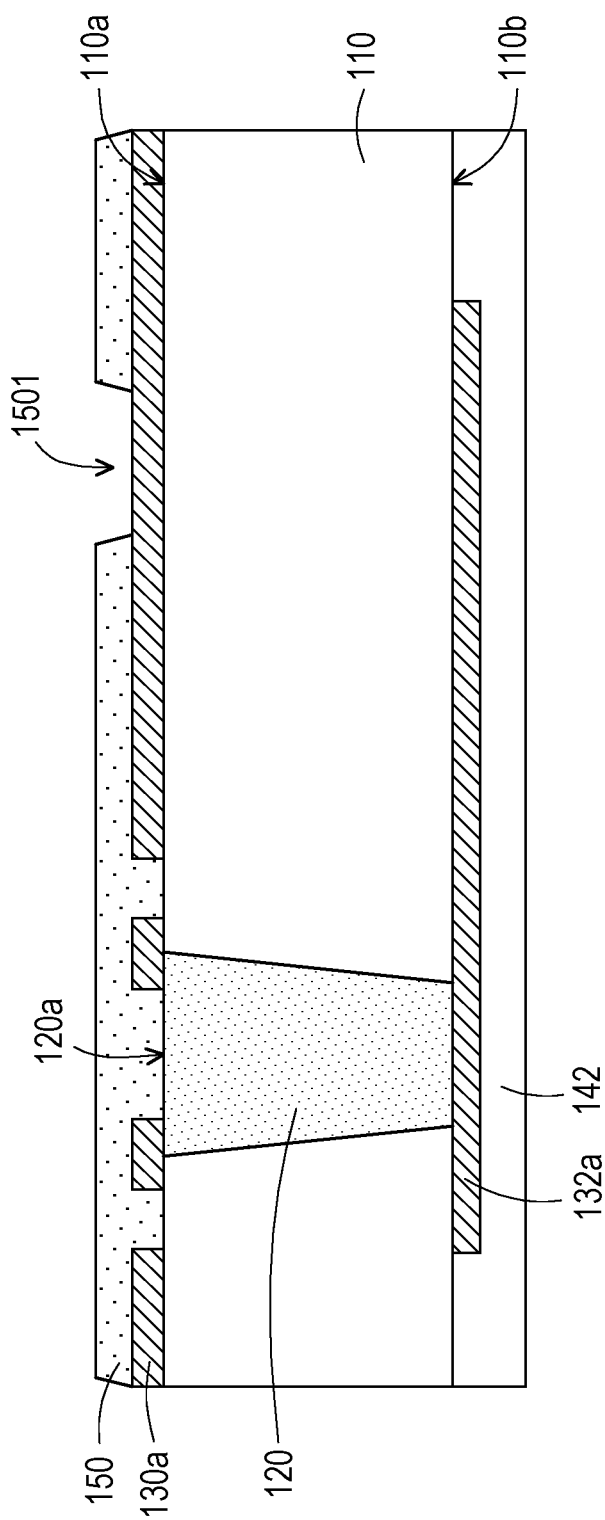

Next, referring to FIG. 1E, a dielectric layer 150 is formed on the surface 110a of the substrate 110 so that the dielectric layer 150 may cover the first conductive layer pattern 130a and the surface 110a and the first surface 120a exposed by the first conductive layer pattern 130a. The dielectric layer 150 has an opening 1501 to expose part of the first conductive layer pattern 130a. The material of the dielectric layer 150 may include organic materials, inorganic materials, or a combination thereof, but the disclosure is not limited thereto.

Figure 1F:
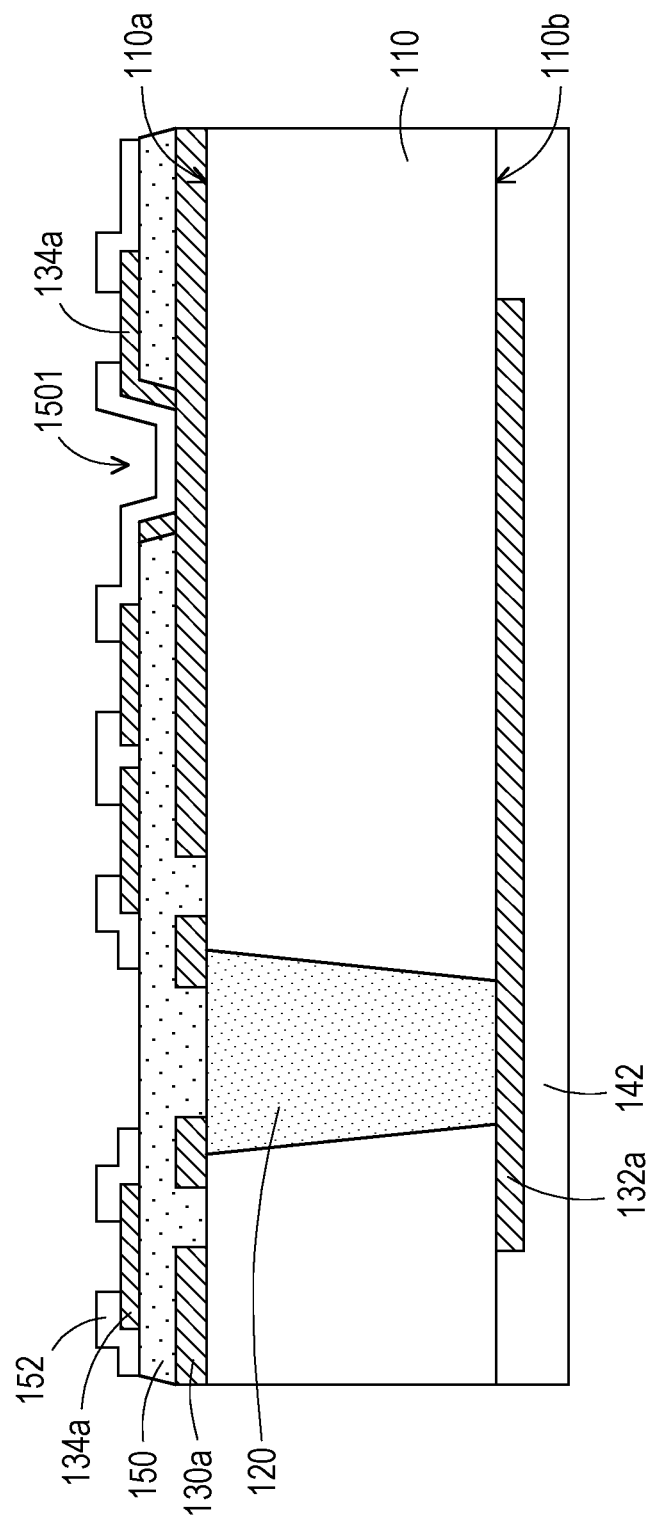

Next, referring to FIG. 1F, a conductive layer pattern 134a is formed on the dielectric layer 150, and a dielectric layer pattern 152 is formed on the conductive layer pattern 134a. The conductive layer pattern 134a may be disposed in the opening 1501, so that the conductive layer pattern 134a may be electrically coupled to the first conductive layer pattern 130a. The dielectric layer pattern 152 may cover the dielectric layer 150 exposed by the conductive layer pattern 134a, part of the conductive layer pattern 134a, and the opening 1501. The material of the dielectric layer pattern 152 may include epoxy resin, silicon nitride, other suitable dielectric materials, or a combination thereof, but the disclosure is not limited thereto.

Figure 1G:
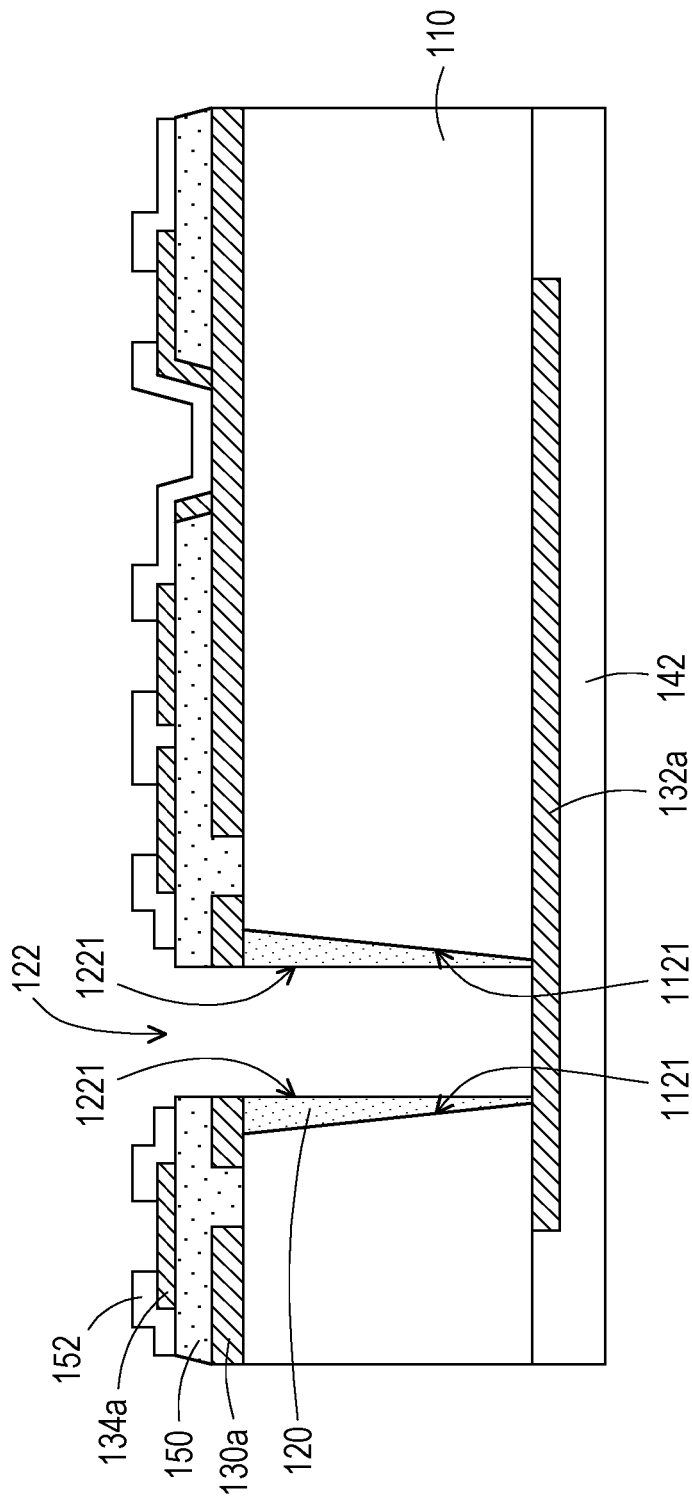

Next, referring to FIG. 1G, a second opening 122 is formed in the polymer layer 120. The second opening 122 may penetrate the polymer layer 120, the first conductive layer pattern 130a, and the dielectric layer 150 to expose part of the second conductive layer pattern 132a. In the embodiment, for example, the second opening 122 is formed by laser drilling, but the disclosure is not limited thereto. Moreover, in the embodiment, when the second opening 122 is formed, most of the polymer layer 120 may be removed, and the polymer layer 120 attached to the sidewall 1121 is remained.

Figure 1H:
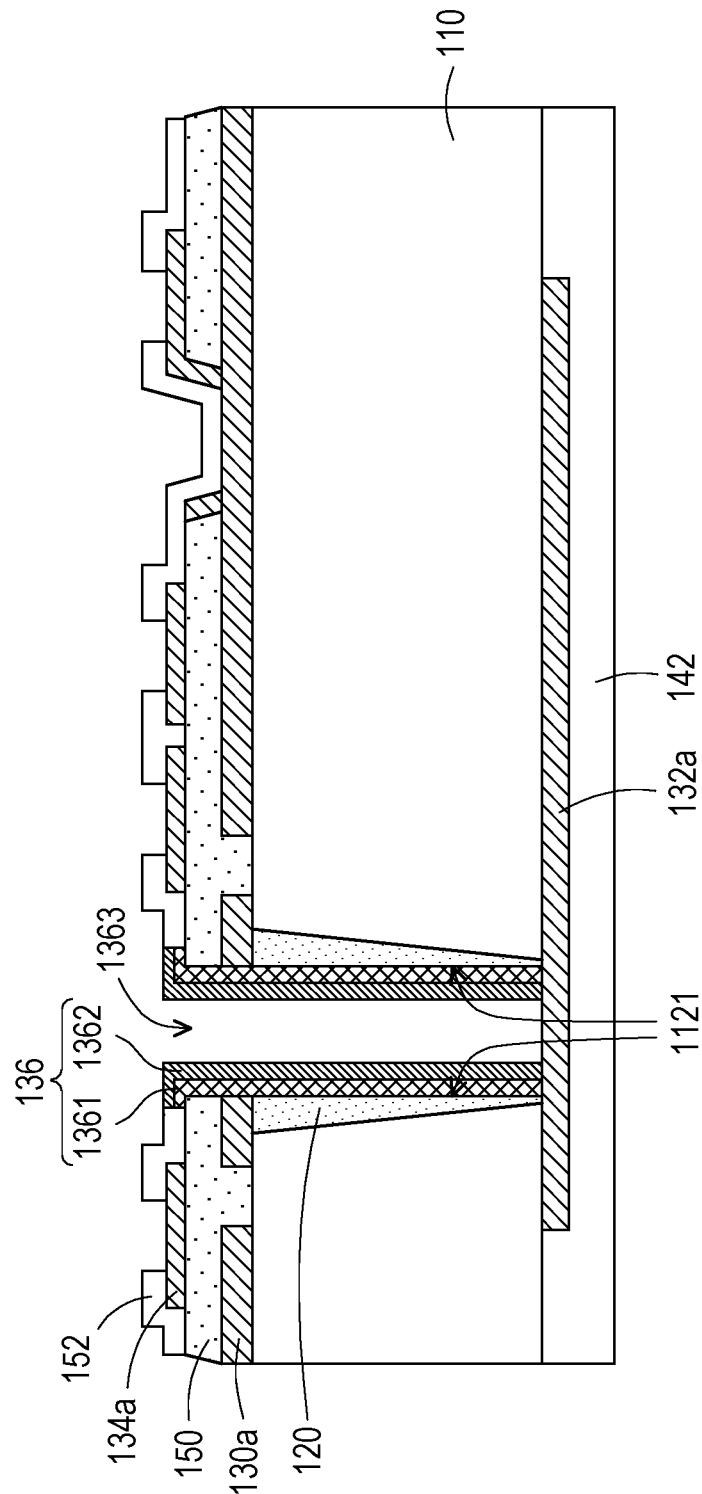

Next, referring to FIG. 1H, a third conductive layer 136 is formed in the second opening 122. The third conductive layer 136 is filled in part of the second opening 122 and has a third opening 1363 in the third conductive layer 136. The third conductive layer 136 may include a first conductive material 1361 and a second conductive material 1362. The first conductive material 1361 may be in contact with the dielectric layer pattern 152, the dielectric layer 150, the first conductive layer pattern 130a, the polymer layer 120, and the second conductive layer pattern 132a, and the second conductive material 1362 may be in contact with and cover the first conductive material 1361. The first conductive material 1361 and the second conductive material 1362 may cover the sidewall of the polymer layer 120 to modify the polymer layer 120. The material of the first conductive material 1361 may include palladium (Pd), platinum (Pt), other suitable metal materials, a combination thereof, or an alloy thereof, but the disclosure is not limited thereto. The material of the second conductive material 1362 may include copper, aluminum, silver, other suitable metal materials, a combination thereof, or an alloy thereof, but the disclosure is not limited thereto.

In the embodiment, for example, the third conductive layer 136 is formed by steps as follows, but the disclosure is not limited thereto. First, the first conductive material 1361 is formed in the second opening 122 by electroless plating so that the first conductive material 1361 may cover the sidewall 1221 of the second opening 122. Next, the second conductive material 1362 is formed in the second opening 122 by electroless plating so that the second conductive material 1362 may cover the first conductive material 1361 and is filled in the second opening 122. In the embodiment, the first conductive material 1361 and the second conductive material 1362 are formed by the same method. In other embodiments, the first conductive material 1361 and the second conductive material 1362 may be formed by different methods. In the embodiment, since the third conductive layer 136 may be in contact with and electrically coupled to the first conductive layer pattern 130a and the second conductive layer pattern 132a, a signal from the another surface 110b of the substrate 110 may be transmitted to the surface 110a of the substrate 110 through the third conductive layer 136 at the shortest line distance (i.e., the thickness T of the substrate 110), and therefore the effect of shortening the distance of signal transmission is produced. The shortest line distance is the shortest distance between the first conductive layer pattern 130a and the second conductive layer pattern 132a, for example. Moreover, the design may also facilitate the circuit design and reduce signal loss.

Moreover, in the embodiment, the third opening 1363 may penetrate the third conductive layer 136, and the third opening 1363 may expose part of the second conductive layer pattern 132a.

Figure 1I:
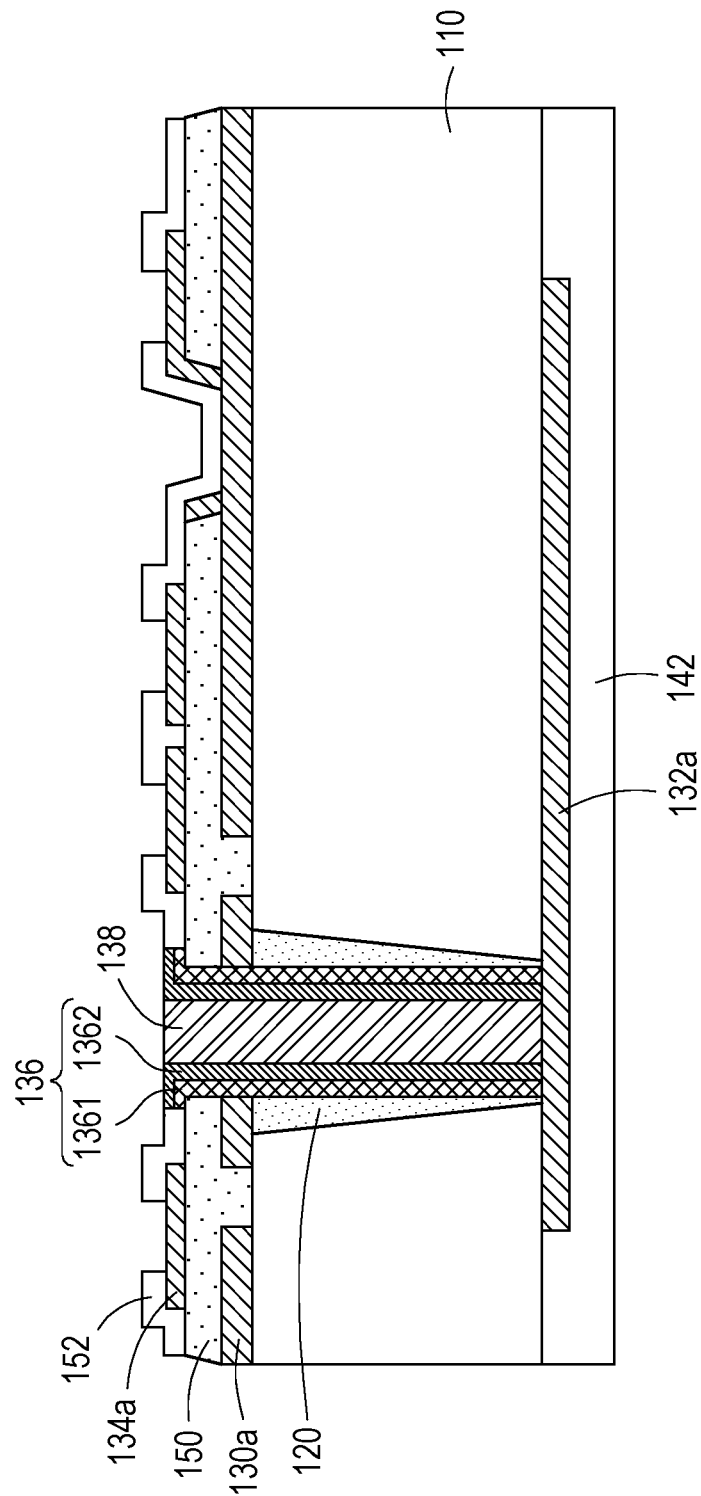

Next, referring to FIG. 1I, a conductive material 138 is formed in the third opening 1363. In the embodiment, the conductive material 138 is formed by vacuum screen printing, for example, but the disclosure is not limited thereto. The material of the conductive material 138 may include copper, aluminum, silver, other suitable metal materials, a combination thereof, or an alloy thereof, but the disclosure is not limited thereto. Moreover, in the embodiment, the conductive material 138 may be filled in the third opening 1363. The conductive material 138 may be in contact with the third conductive layer 136 and the second conductive layer pattern 132a. Since the conductive material 138 can be electrically coupled to the first conductive layer pattern 130a and the second conductive layer pattern 132a through the third conductive layer 136, the signal from the another surface 110b of the substrate 110 may be transmitted to the surface 110a of the substrate 110 through the third conductive layer 136 and the conductive material 138 at the shortest line distance (i.e., the thickness T of the substrate 110), and therefore the effect of shortening the distance of signal transmission is produced. Moreover, in the embodiment, the conductive material 138 may also be used for heat dissipation.

Although the conductive material 138 is filled in the third opening 1363 in the embodiment, the disclosure does not limit the material filled in the third opening 1363. That is, in some embodiments, another polymer layer (not shown) may also be used to replace the conductive material 138 of the embodiment, that is, another polymer layer (not shown) is formed in the third opening. Another polymer layer is filled in the third opening 1363 to protect the sidewall metal (i.e., the second conductive material 1362) to prevent oxidation of the sidewall metal.

Figure 1J:
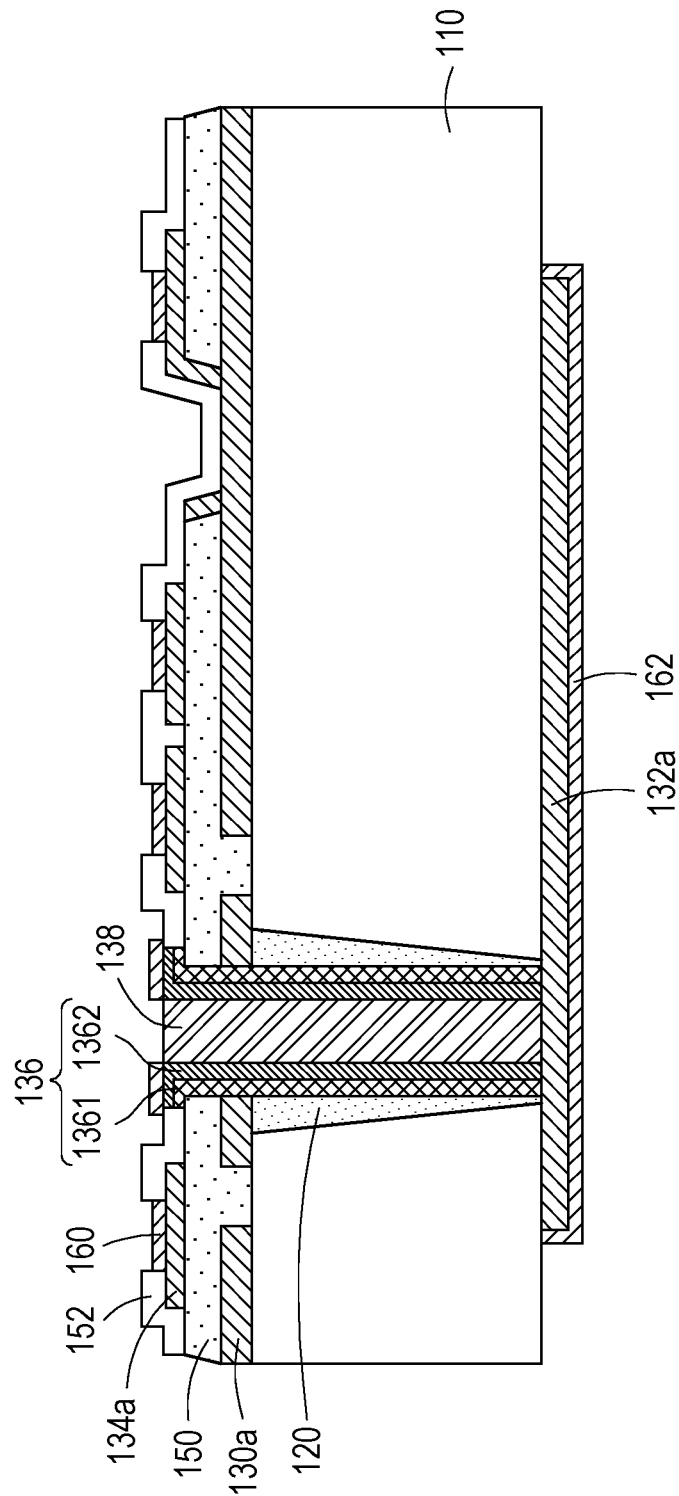

Next, referring to FIG. 1J, after the protection layer 142 is removed, a surface treatment layer 160 is formed on the conductive layer pattern 134a exposed by the dielectric layer pattern 152 and on the third conductive layer 136, and a surface treatment layer 162 is formed on the second conductive layer pattern 132a. The materials of the surface treatment layer 160 and the surface treatment layer 162 are electroless nickel immersion gold (ENIG), for example, but the disclosure is not limited thereto.

In other embodiments, the third conductive layer 136 may be omitted, the conductive material 138 is directly filled in the second opening 122, and the conductive material 138 is electrically coupled to the first conductive layer pattern 130a and the second conductive layer pattern 132a.

In other embodiments, the second opening 122 may not penetrate the substrate 110, and the conductive material 138 is filled therein to be electrically coupled to the first conductive layer pattern 130a and the second conductive layer pattern 132a. Alternatively, the third conductive layer 136 is filled in part of the second opening 122, the third conductive layer 136 has a third opening 1363, and the conductive material 138 is filled in the third opening 1363 to be electrically coupled to the first conductive layer pattern 130a and the second conductive layer pattern 132a.

Figure 1K:
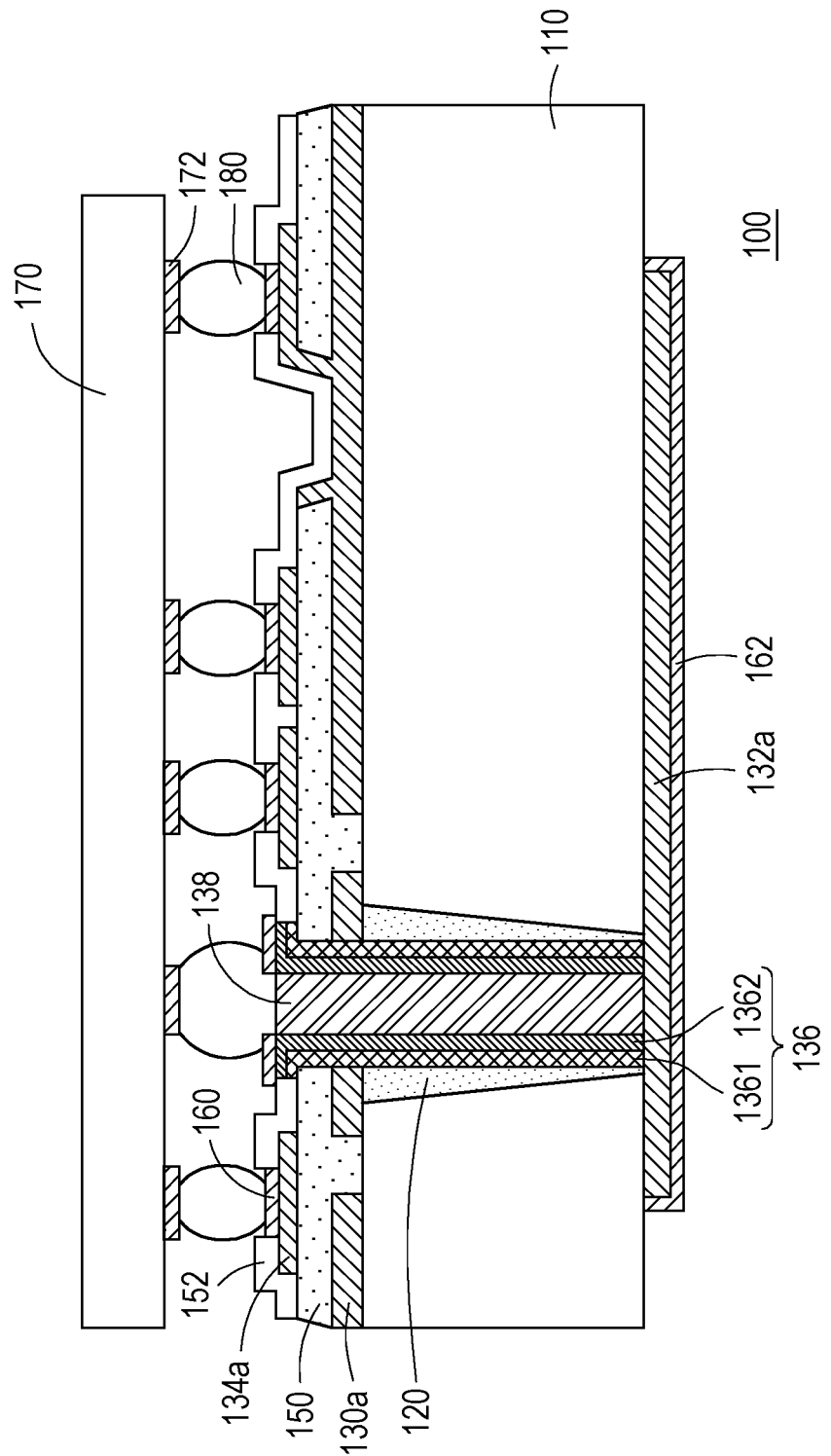

Next, referring to FIG. 1K, a chip 170 is disposed on the surface 110a of the substrate 110. The chip 170 has multiple pads 172 so that the chip 170 may be bonded to the surface treatment layer 160 through the pads 172 and solder balls 180. In some embodiments, the chip 170 may also be bonded and electrically coupled to the conductive material 138 through the solder balls 180 and the pads 172. Moreover, in the embodiment, the chip 170 may include a radio frequency IC, a phase shifter, a power amplifier, or a high speed digital IC, but the disclosure is not limited thereto. Finally, the manufacture of the electronic device 100 of the embodiment is completed.

In summary, in the manufacturing method of the electronic device of the embodiment of the disclosure, since the third conductive layer may be in contact with and electrically coupled to the first conductive layer and the second conductive layer, the signal from the another surface of the substrate may be transmitted to the surface of the substrate through the third conductive layer at the shortest line distance (i.e., the thickness of the substrate), and therefore the manufacturing method of the electronic device of the embodiment of the disclosure has the effect of shortening the distance of signal transmission. Moreover, the conductive material is disposed in the third opening, so the conductive material may be electrically coupled to the first conductive layer and the second conductive layer through the third conductive layer, so that the conductive material may also be configured to shorten the distance of signal transmission.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method of an electronic device, comprising:
   providing a substrate;
   forming a first opening so that the first opening penetrates the substrate; and
   forming a polymer layer in the first opening, wherein the polymer layer is in contact with a sidewall of the substrate at the first opening;
   forming a first conductive layer pattern on a surface of the substrate;
   forming a second conductive layer pattern on another surface of the substrate, wherein the another surface is opposite to the surface; and
   forming a second opening in the polymer layer, wherein the second opening exposes the second conductive layer pattern;
   wherein before forming the second opening in the polymer layer, the manufacturing method further comprises:
   forming a dielectric layer on the surface of the substrate to cover the first conductive layer pattern;
   forming a conductive layer pattern on the dielectric layer so that the conductive layer pattern is electrically coupled to the first conductive layer pattern.

2. The manufacturing method of the electronic device according to claim 1, wherein the polymer layer comprises a first surface and a second surface opposite to each other, the first surface is aligned with the surface of the substrate, and the second surface is aligned with the another surface of the substrate.

3. The manufacturing method of the electronic device according to claim 1, wherein the polymer layer comprises a first surface and a second surface opposite to each other, the first surface is lower than the surface of the substrate, and the second surface is lower than the another surface of the substrate.

4. The manufacturing method of the electronic device according to claim 1, wherein the first conductive layer pattern is in contact with the surface of the substrate and a first surface of the polymer layer.

5. The manufacturing method of the electronic device according to claim 1, wherein before forming the first conductive layer pattern on the surface of the substrate, the manufacturing method further comprises:
   forming a first conductive layer on the surface of the substrate; and
   forming a protection layer on the surface of the substrate to cover the first conductive layer.

6. The manufacturing method of the electronic device according to claim 5, wherein after forming the second conductive layer pattern on the another surface of the substrate, the manufacturing method further comprises:
   forming another protection layer on the another surface of the substrate to cover the second conductive layer pattern.

7. The manufacturing method of the electronic device according to claim 1, wherein the second conductive layer pattern is in contact with the another surface of the substrate and a second surface of the polymer layer.

8. The manufacturing method of the electronic device according to claim 1, wherein the second opening penetrates the polymer layer, the first conductive layer pattern, and the dielectric layer to expose the second conductive layer pattern.

9. The manufacturing method of the electronic device according to claim 1, further comprising:
   forming a dielectric layer pattern on the conductive layer pattern to cover the dielectric layer.

10. The manufacturing method of the electronic device according to claim 9, further comprising:
    forming a surface treatment layer on the conductive layer pattern exposed by the dielectric layer pattern.

11. The manufacturing method of the electronic device according to claim 1, further comprising:
    forming a conductive material in the second opening, wherein the conductive material is electrically coupled to the first conductive layer pattern and the second conductive layer pattern.

12. The manufacturing method of the electronic device according to claim 1, further comprising:
    forming a third conductive layer in the second opening.

13. The manufacturing method of the electronic device according to claim 12, further comprising:
    filling the third conductive layer in part of the second opening, wherein the third conductive layer comprises a third opening.

14. The manufacturing method of the electronic device according to claim 13, wherein the third opening penetrates the third conductive layer.

15. The manufacturing method of the electronic device according to claim 14, further comprising:

forming a conductive material in the third opening.

16. The manufacturing method of the electronic device according to claim 15, wherein the conductive material is electrically coupled to the first conductive layer pattern and the second conductive layer pattern.

17. The manufacturing method of the electronic device according to claim 13, further comprising:

forming another polymer layer in the third opening.

* * * * *